(12) United States Patent
Karp et al.

(10) Patent No.: US 9,575,111 B1
(45) Date of Patent: Feb. 21, 2017

(54) ON CHIP DETECTION OF ELECTRICAL OVERSTRESS EVENTS

(71) Applicant: Xilinx, Inc., San Jose, CA (US)

(72) Inventors: James Karp, Saratoga, CA (US); Michael J. Hart, Palo Alto, CA (US); John K. Jennings, Dublin (IE)

(73) Assignee: XILINX, INC., San Jose, CA (US)

( * ) Notice: Subject to any disclaimer, the term of this patent is extended or adjusted under 35 U.S.C. 154(b) by 767 days.

(21) Appl. No.: 13/942,626

(22) Filed: Jul. 15, 2013

(51) Int. Cl.
*H02H 3/00* (2006.01)
*G01R 31/26* (2014.01)
*H02H 3/20* (2006.01)
*H03K 17/08* (2006.01)

(52) U.S. Cl.
CPC .............. *G01R 31/26* (2013.01); *H02H 3/00* (2013.01); *H02H 3/20* (2013.01); *H03K 17/08* (2013.01)

(58) Field of Classification Search
CPC .......... G01R 31/26; H03K 17/08; H02H 3/00; H02H 3/04; H02H 3/20; H02H 3/202; H02H 5/00
See application file for complete search history.

(56) References Cited

U.S. PATENT DOCUMENTS

| 4,888,498 | A | * | 12/1989 | Kadakia | ................ | G11C 16/20 326/45 |
| 5,896,324 | A | * | 4/1999 | Jang | ....................... | G11C 5/143 365/189.07 |
| 6,411,544 | B1 | * | 6/2002 | Devin | ................. | G11C 16/225 365/185.01 |
| 6,819,539 | B1 | * | 11/2004 | Wright | ..................... | G06F 1/30 361/90 |
| 7,102,415 | B1 | * | 9/2006 | Potanin | ............ | G01R 19/16571 320/162 |
| 7,414,438 | B1 | * | 8/2008 | Nulsen | ................ | H03K 5/1252 324/76.25 |

OTHER PUBLICATIONS

Ker, M.D. et al., "On-Chip ESD Detection Circuit for System-Level ESD Protection Design," In IEEE 10th Int'l Conf. on Solid-State and Integrated Circuit Technology (ICSICT), 2010, pp. 1584-1587.
"UCD90120/4 Power Supply Sequencer and System Health Controller," [online] Texas Instruments © 2012, In System-Level ESD/EMI Protection Guide (Rev. B), 41 pg., retrieved from the Internet: <http://www.ti.com/lit/ml/sszb130b/sszb130b.pdf>.

* cited by examiner

*Primary Examiner* — Jung Kim
(74) *Attorney, Agent, or Firm* — Kevin T. Cuenot

(57) ABSTRACT

A system configured for detecting electrical overstress events within an integrated circuit includes a comparator configured to determine whether a monitored voltage level of a monitored signal exceeds an overstress reference voltage level. The overstress reference voltage level is a predetermined amount of voltage above a nominal voltage level for the monitored signal. The system further includes a write circuit coupled to an output of the comparator. The write circuit is configured to indicate an occurrence of an electrical overstress event within the integrated circuit responsive to the comparator determining that the monitored voltage level exceeds the overstress reference voltage level.

10 Claims, 5 Drawing Sheets

ON CHIP DETECTION OF ELECTRICAL OVERSTRESS EVENTS

FIELD OF THE INVENTION

This specification relates to integrated circuits (ICs) and, more particularly, to detecting an electrical overstress event in the IC in which the event occurs.

BACKGROUND

Modern integrated circuits (ICs) are susceptible to electrical overstress (EOS) events and electrostatic discharge (ESD) events. EOS refers to a situation in which a device, such as an IC or a die, is subjected to excessive voltage, current, or power. ESD refers to a particular type of EOS event involving a rapid transfer of electrostatic charge between two elements in a device. Modern ICs are susceptible to these types of events despite meeting various component-level qualifications such the human-body-model (HBM) test, the machine-model (MM) test, and the charged-device-model (CDM) test.

Often, the occurrence of an EOS event does not result in immediate failure of a device. What typically occurs is that each EOS event degrades some aspect of the device. This degradation can significantly reduce the lifespan of the device. In the usual case, an EOS event leaves behind no physical evidence within the device that the event ever occurred. As such, if the device fails after a shorter than expected lifespan, it is difficult to determine the cause of the failure. Failure analysis is unable, for example, to determine whether the device failed as a result of a manufacturing defect or exposure to one or more EOS events.

SUMMARY

This specification relates to integrated circuits (ICs) and, more particularly, to detecting an electrical overstress event in the IC in which the event occurs.

One aspect includes a system implemented within an IC. The system includes a comparator configured to determine whether a monitored voltage level of a monitored signal exceeds an overstress reference voltage level. The overstress reference voltage level is a predetermined amount of voltage above a nominal voltage level for the monitored signal. The system further includes a write circuit coupled to an output of the comparator. The write circuit is configured to indicate an occurrence of an electrical overstress event within the IC responsive to the comparator determining that the monitored voltage level exceeds the overstress reference voltage level.

Another aspect includes an IC. The IC includes a first electrical overstress detection system configured to detect a first electrical overstress event and a second electrical overstress detection system configured to detect a second electrical overstress event. The first electrical overstress event differs from the second electrical overstress event by at least one of a duration of the electrical overstress event or a magnitude of the electrical overstress event.

Another aspect includes a method. The method includes, using a comparator of an integrated circuit, determining that a monitored voltage level of a monitored signal exceeds an overstress reference voltage level. The overstress reference voltage level is a predetermined amount of voltage above a nominal voltage level for the monitored signal. The method further includes, responsive to determining that the monitored voltage level exceeds the overstress reference voltage level, indicating that an electrical overstress event has occurred within the integrated circuit.

DETAILED DESCRIPTION OF THE DRAWINGS

Figure 1:
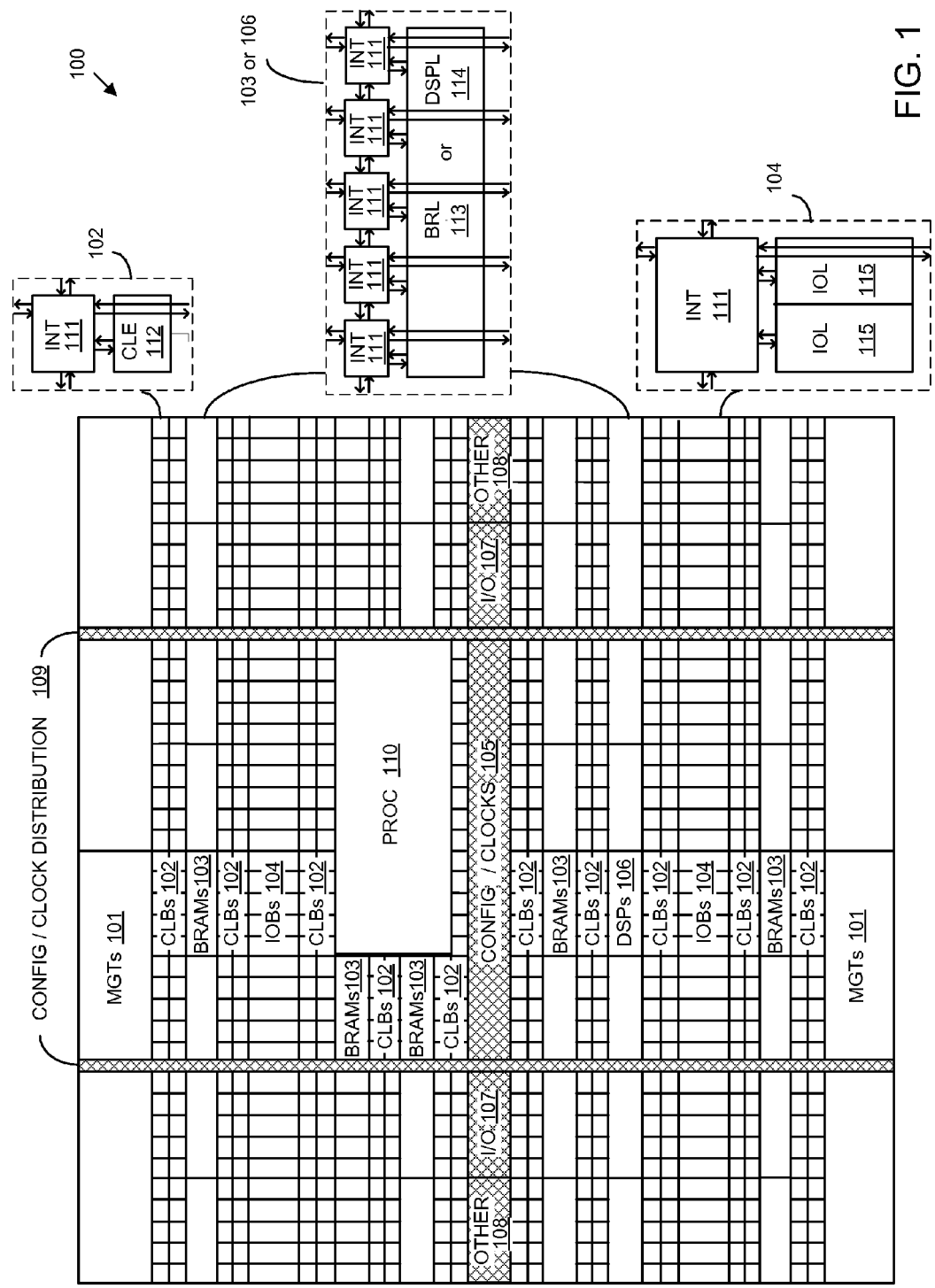
FIG. 1 is a block diagram illustrating an exemplary architecture for an integrated circuit (IC) type of device.

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

This specification relates to integrated circuits (ICs) and, more particularly, to detecting an electrical overstress (EOS) event in the IC in which the event occurs. A historical record of the occurrence of the EOS event can be maintained within the IC itself or provided to a destination external to the IC. Within this specification, unless otherwise stated, or the context indicates otherwise, the phrase "EOS event" refers to both EOS events and electrostatic discharge (ESD) events.

In accordance with the inventive arrangements disclosed within this specification, EOS events can be detected by monitoring selected signals and comparing the monitored signals with one or more reference voltages. More particularly, a voltage level of the monitored signal, in general, is compared with a voltage level of the reference voltage. The voltage level of the reference voltage is set to specify, or represent, a predetermined amount of voltage above a nominal voltage level. Thus, the reference voltage has a voltage level that, if exceeded by the monitored signal, indicates the occurrence of an EOS event. A determination that the voltage level of the monitored signal exceeds the voltage level of the reference signal means that an EOS event has been detected and/or occurred.

Responsive to detecting the EOS event, an indication of the event is generated. In one aspect, the indication is output from the IC to another device or system. In that case, the indication can be stored external to the IC or used for purposes of real-time monitoring of the IC. In another aspect, the indication is stored in, or written to, a non-volatile memory within the IC in which the EOS event is detected.

The lack of physical evidence left in a device after the occurrence of an EOS event makes diagnosing the cause of a device failure difficult, if not impossible. For example, in the event a device fails well before the end of the expected lifespan of the device, the device may be returned to the manufacturer or seller for failure analysis. By storing an indication that one or more EOS events occurred, whether by outputting such indications or storing such indications on-chip, a permanent record is created memorializing the occurrence of the EOS event(s). The record of EOS events then can be used for purposes of failure analysis for the device, for providing real-time indications of EOS events within the device to one or more other devices, or the like.

FIG. 1 is a block diagram illustrating an exemplary architecture 100 for an IC type of device. Architecture 100 can be used to implement a programmable type of IC. In one aspect, for example, architecture 100 is implemented within a field programmable gate array (FPGA), which is one variety of programmable IC. An EOS detection system, as described within this specification, can be implemented as part of an IC having architecture 100.

As shown, architecture 100 includes several different types of programmable circuit, e.g., logic, blocks. For example, architecture 100 can include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 can include a configurable logic element (CLE) 112 that can be programmed to implement user logic plus a single INT 111. A BRAM 103 can include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also can be used. A DSP tile 106 can include a DSP logic element (DSPL) 114 in addition to an appropriate number of INTs 111. An IOB 104 can include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, can be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks can be programmable blocks and/or dedicated circuitry. For example, a processor block depicted as PROC 110 spans several columns of CLBs and BRAMs.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks can be utilized to form a "soft processor" in that the various blocks of programmable circuitry can be used to form a processor that can execute program code as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 103 and BRAMs 103 can be considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC. PROC 110 is an example of hardwired or hardened circuitry.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation.

In one aspect, one or more of the illustrated blocks, e.g., columns of CLBs 102 or selected blocks within the columns of CLBs 102, can include, or be replaced by, a block implementing an EOS detection system. The EOS detection systems can be used to detect EOS events on a monitored signal. Each of a plurality of different signals can be monitored using one or more EOS detection systems dedicated for that signal. In some cases, the monitored signal is a voltage supply signal as is distributed throughout the IC. In other cases, the monitored signal is a data signal. For example, the MGTs 101 implement one or more data signals including high speed I/O signals that pass through or utilize IOBs 104 and/or IOLs 115. Signals going out from, or coming into, IOBs 104 can be monitored by an EOS detection system as described within this specification. In another aspect, one or more EOS detection systems can be included within an IOB 104. In other cases, data signals within the IC, e.g., internal data signals that are not I/O signals, can be monitored.

It should be appreciated that architecture 100 is presented for purposes of illustration only. Thus, while one or more EOS detection systems can be implemented within an IC using architecture 100, EOS detection systems as described within this specification can be included within any of a variety of different IC types, whether such ICs are programmable or not. For example, EOS detection systems as described herein can be included within application specific ICs, mixed signal ICs, analog ICs, digital ICs, or the like.

Figure 2:
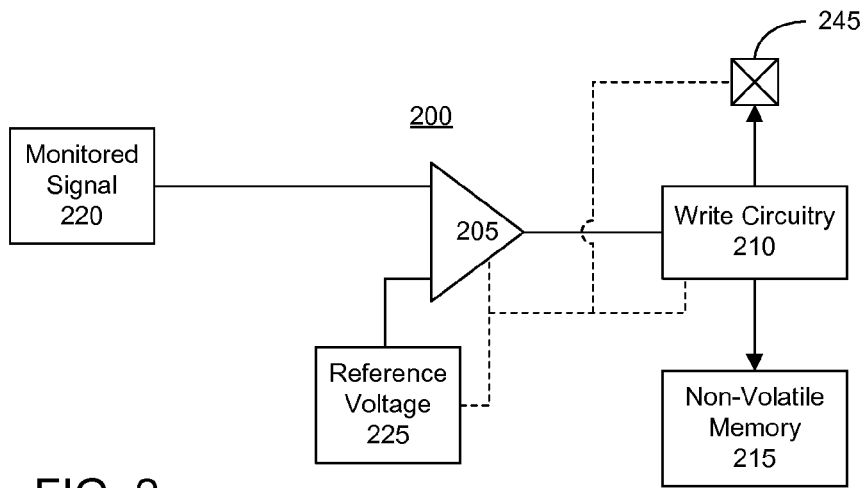
FIG. 2 is a block diagram illustrating an exemplary electrical overstress (EOS) detection system.

FIG. 2 is a block diagram illustrating an exemplary EOS detection system (system) 200. System 200 implements a voltage monitor circuit that can be included within an IC or die type of device. As pictured, system 200 includes a comparator 205, write circuitry 210, and an optional non-volatile memory 215.

Comparator 205 is a circuit element, or combination of circuit elements, that includes two or more inputs and an output. Signals received on each respective input of comparator 205 are compared with one another. When a voltage level of a selected one of the signals exceeds the voltage level of the other signal, comparator 205 outputs an indication. In one aspect, the indication output from comparator 205 is a state change in the output signal such as a transition from low to high or from high to low depending upon the implementation of system 200.

In this example, monitored signal 220 is coupled to a first input of comparator 205. Reference voltage 225 is coupled to a second input of comparator 205. Monitored signal 220 represents the signal being monitored to determine whether an EOS event occurs. The voltage level of monitored signal 220 is referred to as the "monitored voltage level" or as the "first voltage level." The monitored voltage level is compared with the voltage level of reference voltage 225. The voltage level of reference voltage 225 is also referred to herein as the "overstress reference voltage level" or the "second voltage level." Comparator 205 detects an EOS event responsive to determining that the monitored voltage level exceeds the overstress reference voltage level.

Monitored signal 220 can be taken, or split off, from a node within the device in which system 200 is implemented and provided to system 200 for monitoring. In one aspect, monitored signal 220 is a voltage supply signal within the device in which system 200 is implemented. In another aspect, monitored signal 220 is a data signal within such a device. For example, monitored signal 220 can be a high speed signal such as an input signal to the device or an output signal provided from the device as may pass through a serializer/de-serializer (SERDES) circuit block within a high speed transceiver such as MGT 101 of FIG. 1, an IOB 104 of FIG. 1, or the like. Still, monitored signal 220 can be a data signal that is internal within the device, i.e., not an I/O signal.

As noted, reference voltage 225 specifies the overstress reference voltage level to which the monitored voltage level, or a derivative thereof, is compared. The overstress reference voltage level is one that, when exceeded, indicates the occurrence of an EOS event on monitored signal 220. For purposes of illustration, the overstress reference voltage level is typically set to, or representative of, a predetermined amount of voltage above a nominal voltage level of the device. The "nominal voltage" or "nominal voltage level" is an amount or quantity of voltage at which a device is supposed to operate under normal conditions. In some cases, the nominal voltage is expressed as a nominal voltage range. Nominal voltage further can be specified on a per-signal basis, e.g., where different signals in different portions of a device have different nominal voltages.

Accordingly, the overstress reference voltage level is a quantity of voltage that is a predetermined amount of voltage above the nominal voltage. The overstress reference voltage level exceeds the nominal voltage by either a fixed amount of voltage or by a fixed percentage of voltage. In the case where nominal voltage is expressed as a range, the overstress reference voltage level typically is measured from the upper-most, or top, of the nominal voltage range. In illustration, when the nominal voltage range is 0.9 to 1.2 volts, the overstress reference voltage level is a predetermined amount of voltage above 1.2 volts, where 1.2 volts is the upper bound, or top, of the nominal voltage range.

For purposes of illustration, the overstress reference voltage level typically is 1.5 times the nominal voltage. Still, it should be appreciated that the overstress reference voltage level can be set to, or indicate, any of a variety of voltage levels that, if exceeded by monitored signal 220, is considered an EOS event. As noted, an EOS event is one that is considered likely to degrade the device or one or more components of the device that may be exposed to the EOS event.

Write circuitry 210 is operative responsive to the indication output from comparator 205 indicating that an EOS event has occurred or has been detected. In one aspect, write circuitry 210 is operative to write a value or indicator to non-volatile memory 215 responsive to detection of the EOS event. For example, responsive to an indication output from comparator 205 that the monitored voltage level exceeds the overstress reference voltage level, write circuitry 210 writes or stores an indication within non-volatile memory 215. For example, write circuitry 210 can store a bit within non-volatile memory 215.

Non-volatile memory 215 is a collection of one or more memory elements that preserve the data stored therein regardless of whether power to non-volatile memory 215 is removed or otherwise interrupted. In one aspect, non-volatile memory 215 is implemented to include one or more one-time programmable memories or memory cells. Examples of one-time programmable memories include, but are not limited to, fuses or antifuses. Each fuse or antifuse can be used to store an indication of a single EOS event. More particularly, each one-time programmable memory cell can be programmed, e.g., blown, by write circuitry 210 for each detected EOS event.

For example, write circuitry 210 applies a write voltage to a selected one-time programmable memory cell within non-volatile memory 215 responsive to the indication that the first voltage level exceeds the second voltage level. Non-volatile memory 215 can be implemented to include one or more one-time programmable memory cells, thereby allowing the device in which system 200 is implemented to store a record of the occurrence of one or more EOS events. Each programmed one-time programmable memory cell represents the occurrence of one EOS event as detected from a monitored signal.

In another aspect, write circuitry 210 can be configured to output an indication of the occurrence of an EOS event to another system or device. As shown, write circuitry 210 can be configured to output a signal to a pin 245 of the device in which system 200 is implemented. Pin 245, for instance, can be coupled to an IOB 104, part of an MGT 101, or the like as described with reference to FIG. 1. In one example, write circuitry 210 can be implemented as an IOB or output driver for pin 245. Accordingly, a device in which system 200 is included can output signals indicating the occurrence of an EOS event to other devices or systems for storage, further processing, or the like.

It should be appreciated that system 200 can be configured to store an indication of the occurrence of an EOS event in non-volatile memory 215, output an indication of the occurrence of an EOS event to another system or device, or both store the indication on-chip in non-volatile memory 215 and output the indication to another device and/or system. If no record of EOS events need be stored in the device in which system 200 is implemented, then write circuitry 210 outputs the indication to pin 245 and non-volatile memory 245 is excluded from system 200.

In one aspect, reference voltage 225 can be implemented as a battery source. The battery source can include one or more batteries. The battery source is located off-chip, e.g., external to the device in which system 200 is included, and coupled to the device via one or more pins. The battery source can be used not only to implement reference voltage 225, but also can be used to provide power to comparator 205 and to write circuitry 210. The dotted lines coupling reference voltage 225 to comparator 205 and write circuitry 210 represent power supply lines that can be provided when reference voltage 225 is implemented as a battery source. When so configured, the battery source further can supply power to the IOB or I/O circuitry used to output an indication of a detected EOS event through pin 245. By using a battery source as described, system 200 is functional while the device in which system 200 is implemented is powered off, starting up, powering down, or maintained in a lower power state.

For purposes of illustration, consider the case in which reference voltage 225 is a battery source. The nominal voltage range of monitored signal 220 is from 0.9-1.2 volts. Continuing with the prior example in which the overstress reference voltage level is set to 1.5 times nominal, the overstress reference voltage level is set to 1.8 volts. While the monitored voltage level of monitored signal 220 remains below 1.8 volts, system 200 does not detect an EOS event. System 200 determines that an EOS event has occurred when the monitored voltage level exceeds 1.8 volts. In that case, system 200 creates a record of the EOS event within non-volatile memory 215 by write circuitry 210 storing an indicator, e.g., a bit, within non-volatile memory 215 and/or by outputting a signal via pin 245.

Figure 3:
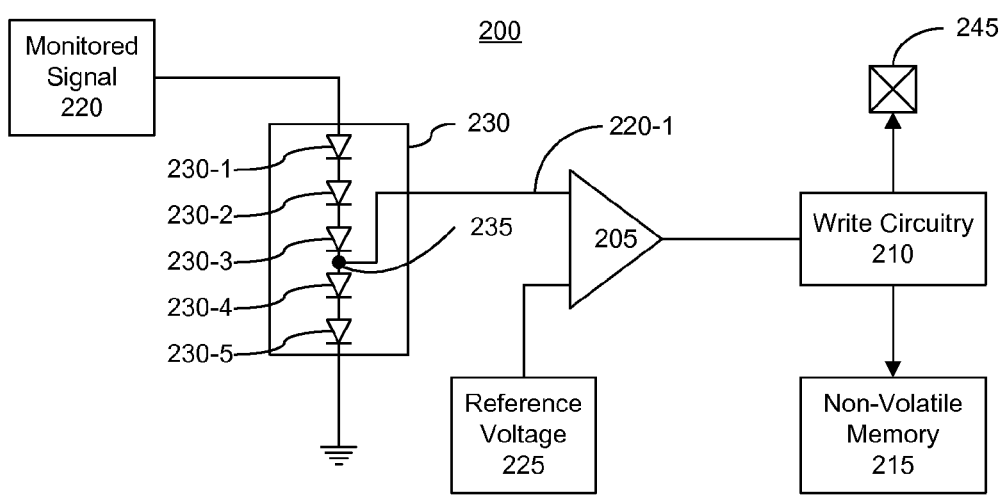
FIG. 3 is a block diagram illustrating another exemplary implementation of an EOS detection system.

FIG. 3 is a block diagram illustrating another exemplary implementation of an EOS detection system. More particularly, FIG. 3 illustrates another implementation of system 200 of FIG. 2. As pictured, monitored signal 220 is provided to a plurality of diodes 230. The plurality of diodes, collectively referred to as diodes 230, are individually referenced as diode 230-1, diode 230-2, diode 230-3, diode 230-4, and diode 230-5. Diodes 230 are serially connected cathode (output) to anode (input). As shown, monitored signal 220 is coupled to an anode of diode 230-1. The last diode of the plurality of diodes 230, i.e., diode 230-5, has a cathode that is coupled to a reference voltage such as ground.

A version of monitored signal 220, referred to as signal 220-1, is obtained from node 235 and provided to the first input of comparator 205. Node 235 represents the junction or connection between the cathode of diode 230-3 and the anode of diode 230-4. In this regard, node 235 is said to "generate" signal 220-1, which is a derivation of monitored signal 220. Signal 220-1 is a proxy for monitored signal 220. By including one or more diodes between monitored signal 220 and the first input of comparator 205, a voltage drop is provided to monitored signal 220 resulting in signal 220-1.

The voltage level that is received by the first input of comparator 205 is the monitored voltage level reduced by "N" times the voltage drop of a single diode, where N is an integer value representing the number of diodes between monitored signal 220 and the first input of comparator 205, i.e., node 235. In the example presented in FIG. 3, presuming each of diodes 230 has a 0.6 volt drop from anode to cathode, signal 220-1 has a voltage level that is 3×0.6=1.8 volts less than the monitored voltage level.

By reducing the voltage level of the signal at the first input of comparator 205, in this case signal 220-1, the voltage level of reference voltage 225 also can be reduced by the same amount. As such, the voltage level received at the second input of comparator 205, and the voltage level provided by reference voltage 225, is the overstress reference voltage level reduced by 1.8 volts. In illustration, consider the case where the overstress reference voltage is 1.5 times the nominal voltage. In FIG. 2, the overstress reference voltage level is 1.5 times the nominal voltage and is provided to the second input of comparator 205. In FIG. 3, the overstress reference voltage level still is 1.5 times the nominal voltage, but is reduced by the diode voltage drop applied to generate signal 220-1. Thus, referring to FIG. 3, the voltage level at the second input of comparator 205 is 1.5(nominal voltage)−(diode voltage drop), wherein "diode voltage drop" is 1.8 volts. Because the voltage at the first input of comparator 205 is reduced, the reference voltage, which is provided to the second input of comparator 205, is reduced by a same amount to a level that is representative of the overstress reference voltage level.

In one aspect, reference voltage 225 is implemented as a band gap reference voltage. In general, a band gap voltage refers to a temperature independent voltage reference circuit commonly found and implemented within ICs. By incorporating diodes 230, the voltage level that is monitored by comparator 205 as a proxy for the monitored signal and the reference signal to which the proxy signal is compared to detect an EOS event are safely below the actual overstress reference voltage level.

If the upper bound of the nominal voltage range of monitored signal 220 is 1.8 volts, then the overstress reference voltage is 1.8 volts times 1.5, which is 2.9 volts. The reduced overstress reference voltage level provided to the second input of comparator is then 2.9 volts minus 1.8 volts, which is 1.1 volts. Thus, when the voltage level of signal 220-1 exceeds 1.1 volts, an EOS event is detected.

Using diodes to provide voltage drops as described allows system 200 to be used for high speed signals since the diodes are characterized by low capacitance. For example, conventional voltage monitoring circuitry uses resistive and capacitive (RC) circuit elements. In consequence, the charging time constant of conventional voltage monitoring circuits renders them unsuitable for use on high speed data signals such as those in the gigabit range. By comparison, system 200, which relies upon diodes as described, can be used to monitor for the occurrence of EOS events on high speed data signals as well as voltage supply signals. Use of system 200 on high speed data signals can be particularly beneficial since such circuits are easily damaged.

Implementation of reference 225 as a band gap voltage, however, does not permit system 200 to detect EOS events that may occur while the device in which system 200 is implemented is powering on, powering off, is powered off, or being maintained in a low power state. In such scenarios, reference 225 is not available and no stable power source exists for elements of system 200. The device must be operational and stable in order to provide power to comparator 205 and write circuitry 210 and, further, to generate a stable reference voltage 225.

In another aspect, reference voltage 225 is implemented as a battery source having one or more batteries. As discussed, when reference voltage 225 is implemented as a battery source, the battery source can provide power to comparator 205, write circuitry 210, and optionally the output circuitry driving pin 245 (power supply lines not illustrated). By using a battery source as described, system 200 is functional while the device in which system 200 is implemented is powering off, is powered off, powering on, or being maintained in a lower power state. The overstress reference voltage level, as provided by reference voltage 225, can be decreased by a voltage drop equal to the voltage drop of one diode 230 multiplied by the number of diodes in the signal path between monitored signal 220 and the first input of comparator 205.

It should be appreciated that signal 220-1 can be taken between any two consecutive diodes of diodes 230 depending upon system architecture and design considerations such as nominal voltage, available battery source voltage, etc. As such, when determining the reduction in the monitored voltage level and the reduction in the overstress reference voltage level, the value of N representing the number of diodes can be set to 1, 2, 3, or 4 (or more) depending upon the architecture of the device and the number of diodes used.

As discussed with reference to FIG. 2, system 200 can be configured to store an indication of the occurrence of the EOS event in non-volatile memory 215, output an indication of the occurrence of an EOS event to another system or device (where non-volatile memory 215 is not required), or both store the indication on-chip in non-volatile memory 215 and output the indication to another device and/or system. The noted configurations can be implemented whether or not diodes are used as illustrated in FIG. 2. When diodes are used, the described configurations can be used with any of a variety of different diode configurations and/or number of diodes.

Figure 4:
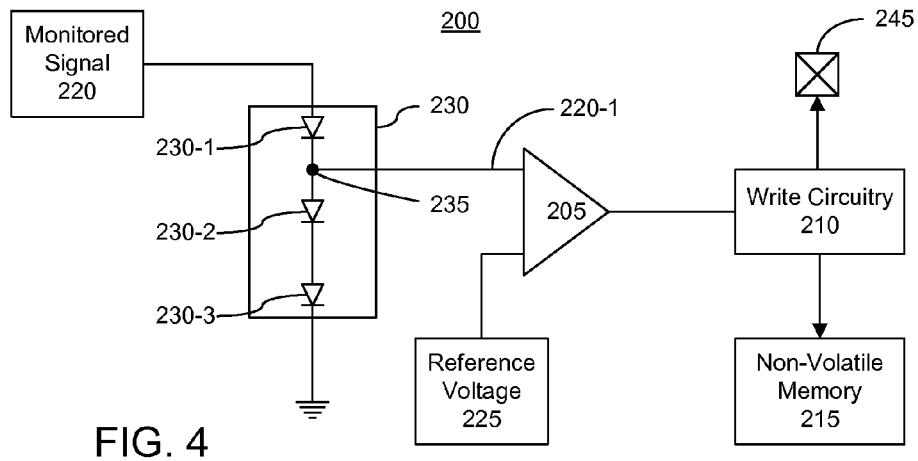
FIG. 4 is a block diagram illustrating another exemplary implementation of an EOS detection system.

FIG. 4 is a block diagram illustrating another exemplary implementation of an EOS detection system. More particularly, FIG. 4 illustrates another implementation of system 200 of FIG. 3. In the example illustrated in FIG. 4, fewer diodes 230 are included. In particular, diodes 230 include only diode 230-1, diode 230-2, and diode 230-3. Node 235 is taken at the junction or connection between the cathode of diode 230-1 and the anode of diode 230-2.

For example, consider the case in which the nominal voltage range is 0.9 volts to 1.2 volts. The overstress reference voltage level is 1.5 times 1.2 volts, which is 1.8 volts. Since signal 220-1 has a voltage drop of 0.6 volts corresponding to diode 230-1, the voltage level provided by reference voltage 225 can be 1.2 volts. The 1.2 volt signal serves as a proxy for a 1.8 volt overstress reference voltage level. The reduction in voltage for reference voltage 225 is equal to the voltage drop from diodes 230 in generating signal 220-1.

As noted, signal 220-1 can be taken between any two consecutive diodes of diodes 230 depending upon system architecture and design considerations. As such, when determining the reduction in the monitored voltage level and the reduction in the overstress reference voltage level, the value of N representing the number of diodes can be set to 1 or 2 depending upon the architecture of the device in which system 200 is implemented.

As noted, system 200 can be configured to store an indication of the occurrence of an EOS event in non-volatile memory 215, output an indication of the occurrence of an EOS event to another system or device (where non-volatile memory 215 is not required), or both store the indication on-chip in non-volatile memory 215 and output the indication to another device and/or system. Further, reference voltage 225 can be implemented as a band gap voltage or as a battery source as discussed.

Figure 5:
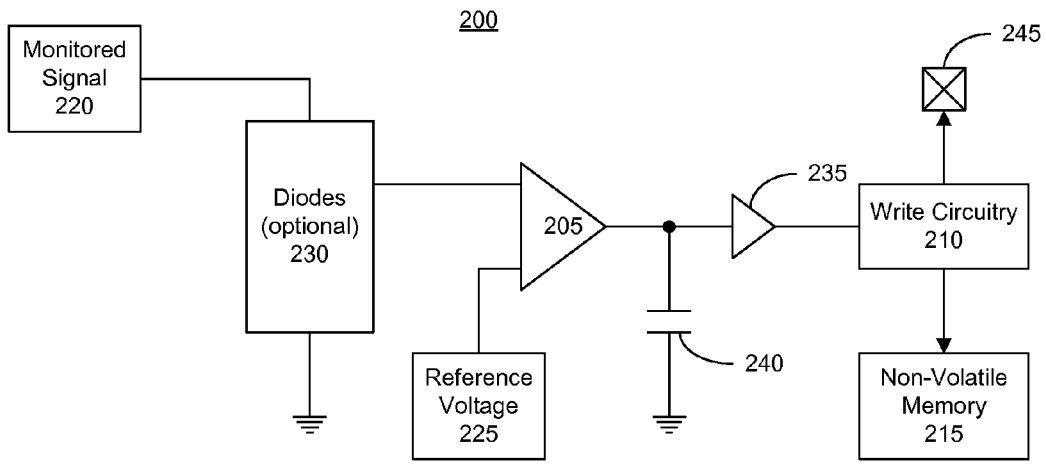
FIG. 5 is a block diagram illustrating yet another exemplary implementation of an EOS detection system.

FIG. 5 is a block diagram illustrating another exemplary implementation of an EOS detection system. More particularly, FIG. 5 illustrates another implementation of system 200 as described with reference to any of FIG. 2, 3, or 4. In FIG. 5, a driver 235 is added to the output of comparator 205. An output of comparator 205 is coupled to an input of driver 235. Further, an output of driver 235 is coupled to an input of write circuitry 210. Further, a capacitor 240 is coupled between the output of comparator 205 and ground.

By adding the circuit structure formed of driver 235 and capacitor 240 to system 200, write circuitry 210 is better able detect momentary transitions at the output of comparator 205 that indicate the occurrence of an EOS event. As such, write circuitry 210 can respond more reliably in order to document the occurrence of the EOS event by writing to non-volatile memory 215 or outputting an indication through pin 245.

As the length or duration of an EOS event can vary, the value of capacitor 240 can be varied to tune system 200 for detecting EOS events of a particular or desired duration. For example, an EOS event having a duration less than a predetermined threshold duration can be filtered out from detection by selection of an appropriate value for capacitor 240. As such, system 200 will only store an indication of an EOS event within non-volatile memory 215, or output an indication of an EOS event to an external system, for an EOS event having a duration at least as long as the threshold duration.

As described with reference to any of FIGS. 2-4, write circuitry 210 can be configured to store an indication of the occurrence of an EOS event in non-volatile memory 215, output an indication of the occurrence of an EOS event to another system or device, or both store the indication on-chip in non-volatile memory and output the indication to another device and/or system. Further, reference voltage 225 can be implemented as a band gap voltage or as a battery source as discussed.

Figure 6:
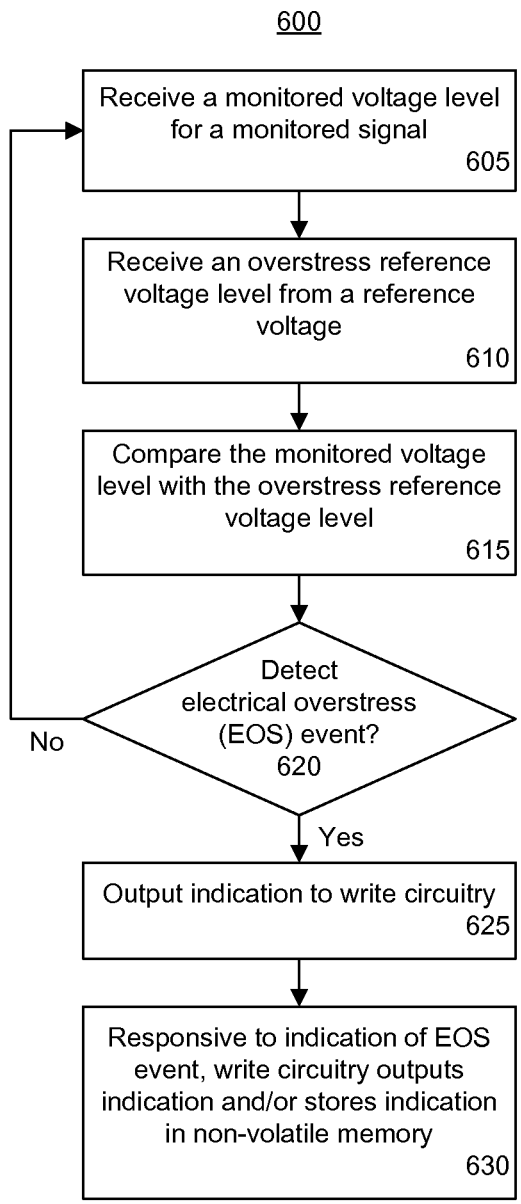
FIG. 6 is a flow chart illustrating an exemplary method of detecting EOS events within a device.

FIG. 6 is a flow chart illustrating an exemplary method 600 of detecting EOS events within an IC. Method 600 can be implemented using the EOS detection system described with reference to any of FIGS. 2-5 of this specification. As such, the EOS detection system, or system, is located within the particular device in which EOS events are to be detected. A device, as noted, refers to an IC or a die.

In block 605, the system receives a monitored voltage level for a monitored signal at a first input of a comparator. As discussed, the monitored voltage level may be from the monitored signal itself or can be reduced by the voltage drop of one or more diodes as determined from a different version of the monitored signal serving as a proxy. In block 610, the system receives an overstress reference voltage level at a second input of the comparator. If the monitored voltage level is reduced by a selected voltage drop, the overstress reference voltage level, as received by the second input of the comparator, is reduced by the same voltage drop, i.e., amount of voltage, applied to the monitored signal.

In block 615, the comparator of the system compares the voltage level received at the first input with the voltage level received at the second input. In one aspect, the comparator compares the monitored voltage level with the overstress reference voltage level. In another aspect, the comparator compares a reduced monitored voltage level with a reduced overstress reference voltage level, where the reduction in each respective signal is the same. The reduction in the monitored voltage level is obtained from one or more diodes.

In block 620, the comparator determines whether an EOS event has been detected. The comparator determines that an EOS event has been detected responsive a determination that the voltage level at the first input exceeds the voltage level received at the second input. If an EOS event has been detected, method 600 continues to block 625. If an EOS event has not been detected, method 600 loops back to block 605 to continue monitoring for the occurrence of an EOS event.

Continuing with block 625, the comparator outputs an indication to the write circuitry of the system. In block 630, responsive to the indication of the occurrence of an EOS event from the comparator, the write circuitry implements any of a variety of actions. In one aspect, the write circuitry outputs an indication of the occurrence of the EOS event to another device or system. In another aspect, the write circuitry stores an indication of the occurrence of the EOS event in a non-volatile memory located within the device with the comparator and the write circuitry. In still another aspect, the write circuitry can output an indication of the occurrence of the EOS event to another device or system as well as store an indication of the occurrence of the EOS event in the non-volatile memory. As noted, in one aspect, the write circuitry stores an indication of an EOS event in non-volatile memory within a one-time programmable memory cell contained therein. The one-time programmable memory cell can be implemented as a fuse or an antifuse that is blown or written as the case may be.

In one example, the stored indication that an EOS event has occurred can correspond to a single one-time programmable memory cell, e.g., a single bit or flag. The non-volatile memory can include a plurality of such one-time programmable memory cells thereby allowing a record of a plurality of EOS events to be created and maintained. In another example, the non-volatile memory can include additional one-time memory cells, e.g., a plurality of such memory cells, available for each EOS event. In that case, a multi-bit indication can be stored for each EOS event. The multi-bit data can include data representing a time stamp, a signal indicator specifying the particular monitored signal of a plurality of monitored signals upon which the EOS event was detected, etc.

Figure 7:
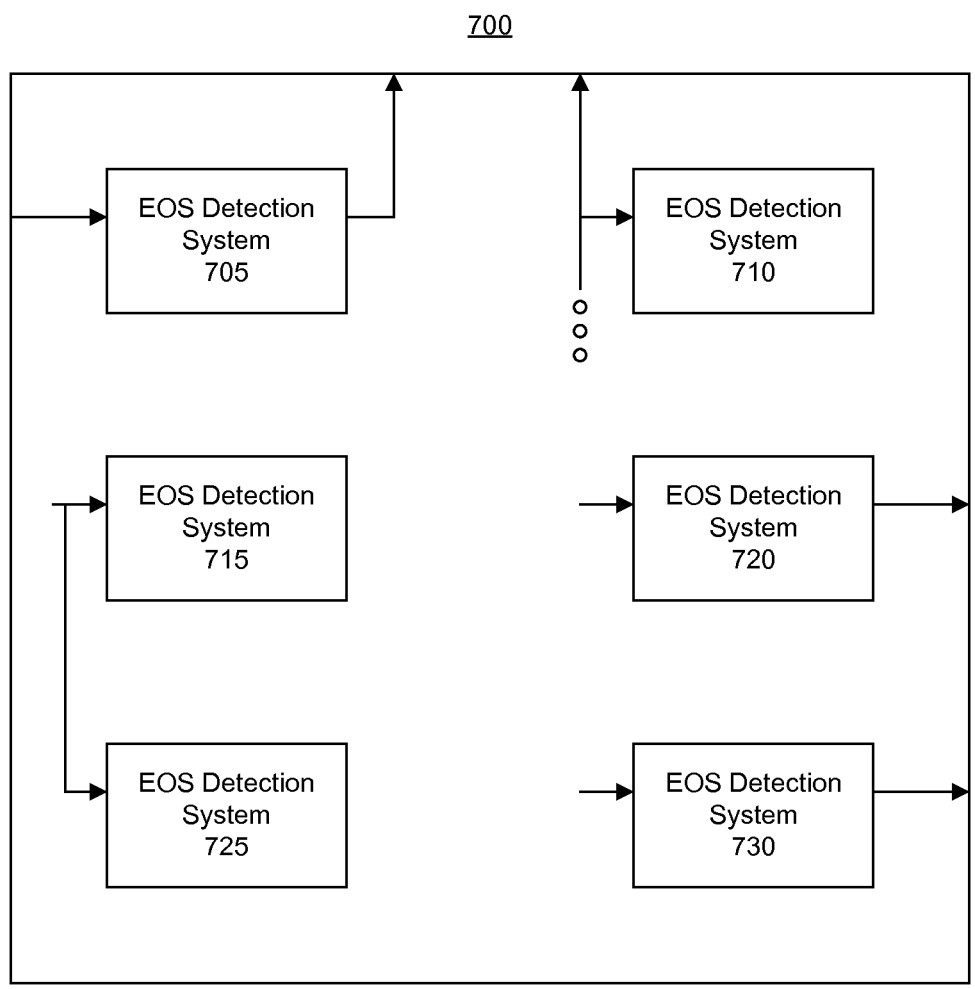
FIG. 7 is a block diagram illustrating an exemplary implementation of a device including a plurality of EOS detection systems.

FIG. 7 is a block diagram illustrating an exemplary implementation of a device 700 including a plurality of EOS detection systems. As noted, device 700 can be implemented as an IC, a die, or the like. When implemented as a die or an IC, device 700 can be any of a variety of different types, whether analog, digital, mixed signal, programmable, etc. In the example pictured in FIG. 7, device 700 includes EOS detection systems 705, 710, 715, 720, 725, and 730.

FIG. 7 illustrates that within a single device, a plurality of differently configured EOS detection systems can be implemented. For example, EOS detection systems 705, 720, and 730 each is configured to monitor for EOS events on a different monitored signal and output an indication of an occurrence of an EOS event on the respective monitored signal using an I/O pin of device 700. As such, at least with respect to the signals monitored by EOS detection systems 705, 720, and 730, a device or system other than device 700 is made aware of the occurrence of an EOS event. Further, one or more or all of EOS detection systems 705, 720, and 730 can be configured to store the indication of the EOS event within a non-volatile memory.

EOS detection system 705 monitors an input signal entering device 700. EOS detection system 710 monitors an output signal exiting device 700. Other ones of the EOS detection systems monitor internal signals, whether data, power supply signals, or the like. Further, whereas each of EOS detection systems 705, 720, and 730 is configured to indicate the occurrence of an EOS event to systems and/or devices external to device 700, each of EOS detection systems 710, 715, 725, and 730 is configured to store such indications within non-volatile memory within device 700.

In another aspect, one or more or all of EOS detection systems 705, 710, 715, 720, 725, and 730 can operate to detect EOS events of differing magnitude. For example, one or more of the EOS detection systems can be implemented so that the version of the monitored signal is passed through N diodes, whereas one or more other EOS detection systems can pass the monitored signal through N+1, N+2, or more diodes. Further, one or more or all EOS detection systems can utilize a different total number of diodes. As such, EOS events of different magnitude, e.g., of different overstress voltages, can be detected. One or more or all of the EOS detection systems may utilize battery sources. As such, one or more EOS detection systems may utilize battery sources while one or more other EOS detection systems in device 700 do not.

Further, in some cases, more than one EOS detection system can be used to monitor a same signal. As illustrated, EOS detection system 715 and EOS detection system 725 receive the same monitored signal. EOS detection system 715 can apply fewer diode(s) between the monitored signal and the first input to the comparator than EOS detection system 725. As such, EOS detection system 715 will detect an EOS event of a lower magnitude than EOS detection system 725. For example, if the overstress voltage level is established at 2.4 volts (e.g., the nominal voltage level is 1.2 volts), EOS detection system 715 can be configured to detect an EOS event in which the voltage reaches at least 2.4 volts, while EOS detection system 725 is configured to detect an EOS event in which the voltage on the monitored signal reaches at least 3.0 volts.

Just as the magnitude of detectable EOS events can be varied within the EOS detection systems by using different diode combinations (or no diodes), so too can the capacitors. Variation in capacitor values allows the EOS detection systems to be configured to detect EOS events of different durations, whether such EOS events have the same or different magnitude, occur on the same or different monitored signals. For example, EOS detection system 715 can be configured to detect either the same or different magnitude of EOS event as EOS detection system 725. This ability is independent of whether EOS detection system 715 detects EOS events of different durations than EOS detection system 725, which may be the case.

Thus, by varying capacitance of the capacitors, EOS detection system 710 can be configured to detect EOS events of a first duration, while EOS detection system 720, 715, etc., can be configured to detect EOS events of a second and different duration. In another illustration, EOS events of a first duration can be detected for power signals, while EOS events of a different duration can be detected for data signals.

In accordance with the inventive arrangements disclosed within this specification, EOS events can be detected on-chip. This allows a historical record of the occurrence of the EOS events to be maintained within the device itself or sent to another external destination, which is useful since there is often little, if any, physical evidence within the device itself that EOS events have occurred. The record of EOS events that have occurred helps diagnose likely causes of device failure that may otherwise be attributed to manufacturing defect(s).

In one or more aspects, a battery source can be used to provide a reference voltage and to power one or more elements of the EOS detection system. This allows the EOS detection system to detect EOS events when the device is powering on, powering off, is powered off, is maintained in a low power state, or the like.

In the case where the reference voltage is implemented as a band gap voltage or other internal voltage source of the device, the use of diodes allows the EOS detection system to be used for monitoring high speed data signals. Conventional voltage monitoring systems are unable to monitor high speed data signals due to the charging time constant inherent to the RC circuit structures that are used. By comparison, the low capacitance of the diodes used in the EOS detection system disclosed herein has little discernible effect upon high speed data signals being monitored. This allows the EOS detection system disclosed within this specification to monitor high speed data signals for EOS events, whereas conventional voltage monitoring systems that utilize RC circuitry cannot.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart and block diagrams in the Figures illustrate the architecture, functionality, and operation of possible implementations of systems and methods according to various aspects of the inventive arrangements disclosed herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. A system implemented within an integrated circuit, the system comprising:

a first comparator configured to determine whether a monitored voltage level of a first monitored signal exceeds an overstress reference signal;

a second comparator configured to determine whether the monitored voltage level of a second monitored signal exceeds the overstress reference signal;

wherein the overstress reference signal is a predetermined amount of voltage above a nominal voltage level for one of the first and second monitored signals;

a write circuit coupled to an output of the first and the second comparators;

wherein the write circuit is configured to indicate a first occurrence of an electrical overstress event and a second occurrence of the electrical overstressed event within the integrated circuit responsive to the first and the second comparators determining that the monitored voltage levels of the first and second monitored signals exceed the overstress reference signal; and a non-volatile memory coupled to the write circuit;

wherein the write circuit is configured to indicate the first occurrence of an electrical overstress event and the second occurrence of an electrical overstress event by storing a first indication and a second indication of the overstress events within the non-volatile memory.

2. The system of claim 1, wherein:
the non-volatile memory comprises a one-time programmable memory cell; and
wherein the write circuit stores the indicator by programming the one-time programmable memory cell.

3. The system of claim 1, wherein:
the write circuit is coupled to an output pin of the integrated circuit; and
the write circuit indicates occurrences of the electrical overstress events within the integrated circuit by outputting indicators from the integrated circuit through the output pin.

4. The system of claim 1, wherein:
the first and the second comparators receive the first monitored signal at a first input;
the first and the second comparators receive a reference signal at the overstress reference signal at a second input; and
the first and the second comparators compare the monitored first and second signals with the reference signal.

5. The system of claim 4, wherein:
the reference signal is provided from a battery source; and
the battery source provides power to the first comparator, the second comparator and the write circuit.

6. The system of claim 1, wherein:
the first comparator receives, at a first input, a version of the first monitored signal;
wherein the version of the first monitored signal has a voltage level that is the monitored voltage level reduced by a voltage drop from at least one diode;
the first comparator receives, at a second input, a reference signal;
wherein the reference signal has a voltage level that is the overstress reference signal reduced by an amount of voltage equal to the voltage drop; and
the first comparator compares the version of the first monitored signal with the reference signal.

7. The system of claim 1, wherein:
the second comparator receives, at a first input, a version of the monitored signal;
wherein the version of the second monitored signal has a voltage level that is the monitored voltage level reduced by a voltage drop from at least one diode;
the second comparator receives, at a second input, a reference signal;
wherein the reference signal has a voltage level that is the overstress reference signal reduced by an amount of voltage equal to the voltage drop; and
the second comparator compares the version of the second monitored signal with the reference signal.

8. The system of claim 6, wherein:
the first monitored signal is coupled to an anode of a first diode of a plurality of diodes;
the plurality of diodes are serially connected;
a cathode of a last diode of the plurality of diodes is coupled to ground;
a first input of the first comparator is coupled to a first and second nodes between two consecutive diodes of the plurality of diodes; and
the nodes generate a version of the first monitored signal.

9. The system of claim 7, wherein:
the second monitored signal is coupled to an anode of a first diode of a plurality of diodes;
the plurality of diodes are serially connected;
a cathode of a last diode of the plurality of diodes is coupled to ground;
a first input of the second comparators is coupled to a first and second nodes between two consecutive diodes of the plurality of diodes; and
the nodes generate versions of the monitored signal.

10. The system of claim 1, further comprising:
first and second drivers having inputs and outputs;
wherein an input of the first and the second drivers are coupled to outputs of the first and the second comparators, and outputs of the first and second drivers are coupled to inputs of the write circuitry; and
the first and second capacitors are coupled between the output of the first and the at least second comparators and ground.

* * * * *